(12) United States Patent
Ju et al.

(10) Patent No.: US 8,047,864 B1
(45) Date of Patent: Nov. 1, 2011

(54) ELECTRICAL CONNECTOR

(75) Inventors: Ted Ju, Keelung (TW); You Hua Cai, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 13/097,979

(22) Filed: Apr. 29, 2011

(30) Foreign Application Priority Data

Jul. 22, 2010 (CN) ...................... 2010 2 0271103 U

(51) Int. Cl.
*H01R 4/58* (2006.01)
(52) U.S. Cl. ........................................ 439/342; 439/884
(58) Field of Classification Search .................... 439/79, 439/855, 83, 70
See application file for complete search history.

(56) References Cited

U.S. PATENT DOCUMENTS

| | | | |
|---|---|---|---|
| 7,771,219 B1 * | 8/2010 | Szu et al. ....................... | 439/259 |
| 7,771,224 B2 * | 8/2010 | Cheng et al. ................... | 439/342 |
| 7,878,839 B2 * | 2/2011 | Cheng et al. ................... | 439/342 |
| 7,963,791 B1 * | 6/2011 | Cai ................................ | 439/342 |
| 2009/0280656 A1 * | 11/2009 | Cheng et al. .................... | 439/55 |
| 2009/0286409 A1 * | 11/2009 | Cheng et al. .................... | 439/68 |
| 2011/0008977 A1 * | 1/2011 | Ju .................................. | 439/75 |
| 2011/0177701 A1 * | 7/2011 | Ju .................................. | 439/65 |

* cited by examiner

*Primary Examiner* — Tulsidas C Patel
*Assistant Examiner* — Phuong Nguyen
(74) *Attorney, Agent, or Firm* — Morris Manning Martin LLP; Tim Tingkang Xia, Esq.

(57) ABSTRACT

An electrical connector is provided, in which each conductive terminal is respectively provided with a first connecting portion at left and right sides of a contact pin of a chip module. A first contact arm and a second contact arm respectively extend upwards from each of the paired first connecting portions, the two first contact arms and the two second contact arms are respectively used for conducting the contact pin, and elastically deform in directions substantially perpendicular to a moving direction of the contact pin. The first contact arm and the second contact arm extending from the same first connecting portion are independent of each other.

19 Claims, 19 Drawing Sheets

ELECTRICAL CONNECTOR

CROSS-REFERENCE TO RELATED APPLICATIONS

This non-provisional application claims priority under 35 U.S.C. §119(a) on Patent Application No. 201020271103.9 filed in The People's Republic of China on Jul. 22, 2010, the entire contents of which are hereby incorporated by reference.

FIELD OF THE INVENTION

The present invention relates to an electrical connector, and more particularly to an electrical connector for electrically connecting a chip module to a circuit board.

BACKGROUND OF THE INVENTION

Currently, an electrical connector is usually used in the field to connect a chip module (or other electronic components) to a circuit board, so as to achieve an effective electrical connection there-between. The electrical connector includes a base, a plurality of conductive terminals disposed in the base, a cover capable of sliding along the base and covered on the base, and a driving mechanism for driving the cover to slide along the base. When a pin of a chip module is conducted with contact arms of the conductive terminal for operation, since a single contact arm is respectively disposed at left and right sides of the pin, the following defects may exist: the conductive terminal provides a small contact area for conducting the pin, which leads to low conductivity and undesirable heat dissipation effect, such that the contact resistance is increased, and poor contact easily occurs due to oxidation of the contact arms after a long-term use.

In order to overcome the above mentioned defects, an electrical connector as shown in FIGS. 1 and 2 has been disclosed in the related art. A basal portion 8041 of a terminal 804 extends upwards to form two elastic arms 8042. The two elastic arms 8042 extend towards each other to respectively form an abutting section 8043. A gap 806 is formed between the two abutting sections 8043. Two sides of the basal portion 8041 extend upwards to form two opposite arm portions 8044. The two arm portions 8044 respectively have a contact portion 8045. The two contact portions 8045 and the two abutting sections 8043 are disposed in a front-rear manner. The two abutting sections 8043 and the two contact portions 8045 define an accommodating space 808. The accommodating space 808 is used for accommodating a pin 810 of a chip module, such that the pin 810 forms a stable four-point contact with the two abutting sections 8043 and the two contact portions 8045. However, since the two elastic arms 8042 are located in a moving direction of the pin 810, a counter thrust against the pin 810 is generated. Although the counter thrust may be quite small, the pin 810 may still be deformed if the pin 810 is under the counter thrust for a long time, such that the contact performance of the pin 810 with the terminal 804 is affected. In addition, if the counter thrusts applied to all the pins 810 jointly react on a cam mechanism (not shown) for driving the chip module to move, it may lead to deterioration of the cam mechanism (not shown), and may also cause breakage of an insulating body 802.

Another electrical connector as shown in FIG. 3 has been disclosed in the related art. The electrical connector includes an insulating body 902 and a plurality of pairs of terminals 904. One receiving hole 9021 of the insulating body 902 respectively receives a pair of the terminals 904. Each of the terminals 904 has a basal portion 9041. An elastic arm 9042 extends upwards from the basal portion 9041. The elastic arm 9042 extends laterally to form two contact arms 9043. A receiving space 908 is formed between the two contact arms 9043 of one pair of the terminals 904. The receiving space 908 is used for accommodating a pin (not shown) of a chip module (not shown), such that the pin (not shown) pushes the contact arms 9043 on two sides of the moving direction thereof, so as to form a four-point contact. However, since the terminal 904 may have a tolerance introduced during manufacturing, a lateral deviation may occur when the terminal 904 is fixed in the receiving hole 9021. The chip module (not shown) may also have a tolerance introduced during manufacturing. Since the same elastic arm 9042 extends laterally to form the two contact arms 9043, the two contact arms 9043 may interfere with each other when undergoing elastic deformation. That is, when the pin (not shown) pushes against the two contact arms 9043, the two contact arms 9043 undergo elastic deformation at the same time due to the elastic arm 9042. Thus, the pin (not shown) cannot contact the contact arms 9043 at two sides thereof. Accordingly, the pin (not shown) cannot form a desired four-point contact with the contact arms 9043.

Therefore, a heretofore unaddressed need exists in the art to address the aforementioned deficiencies and inadequacies.

SUMMARY OF THE INVENTION

In one aspect, the present invention is directed to an electrical connector, in which a first contact arm and a second contact arm on the same first connecting portion of each conductive terminal are independent of each other, so as to prevent one of the contact arms from being expanded outwards when the other contact arm elastically deforms. In addition, the first contact arm and the second contact arm elastically deform in directions substantially perpendicular to a moving direction of the contact pin, so as to prevent the contact pin from being deformed in the moving direction thereof due to a counter thrust.

In one embodiment, the present invention has the following inventive measures and provides an electrical connector that is used for a plurality of contact pins of a chip module to insert, which includes: a base, having a plurality of accommodating holes formed through the base, a cover, covered on the base, and for supporting the chip module, in which the cover is provided with an insertion area for the contact pins to pass through to enter the corresponding accommodating holes, a driving mechanism, for driving the cover, so as to drive the chip module to move backwards and forwards relative to the base, a plurality of conductive terminals, each disposed in one of the accommodating holes respectively, in which each of the conductive terminals has two first connecting portions disposed opposite to each other, respectively located at left and right sides of a moving direction of the contact pin, in which a first contact arm and a second contact arm respectively extend upwards from each of the paired first connecting portions, the two first contact arms and the two second contact arms are respectively used for conducting the contact pin, and elastically deform in directions substantially perpendicular to the moving direction of the contact pin.

As compared with the related art, in the electrical connector of the present invention, each conductive terminal is respectively provided with the first connecting portion at left and right sides of the contact pin, and the first contact arm and the second contact arm extending from the same first connecting portion are independent of each other, so as to avoid interference there-between, thereby ensuring a stable four-point contact. In addition, the first contact arm and the second contact arm elastically deform in directions substantially perpendicular to the moving direction of the contact pin, which avoids the problem that the contact pin is deformed when the contact pin is under a counter thrust in the moving direction thereof and no force is provided to counteract the counter thrust.

In another aspect of the present invention, it is provided a conductive terminal usable in an electrical connector, which is engageable with at least one contact pin of a chip module, and has a base with at least one accommodating hole formed through the base and a cover, positioned on the base and for supporting the chip module, with an insertion area for the at least one contact pin to pass through to enter the corresponding at least one accommodating hole.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The drawings described below are for illustration purpose only. The drawings are not intended to limit the scope of the present teachings in any way.

DETAILED DESCRIPTION OF THE INVENTION

Figure 1:
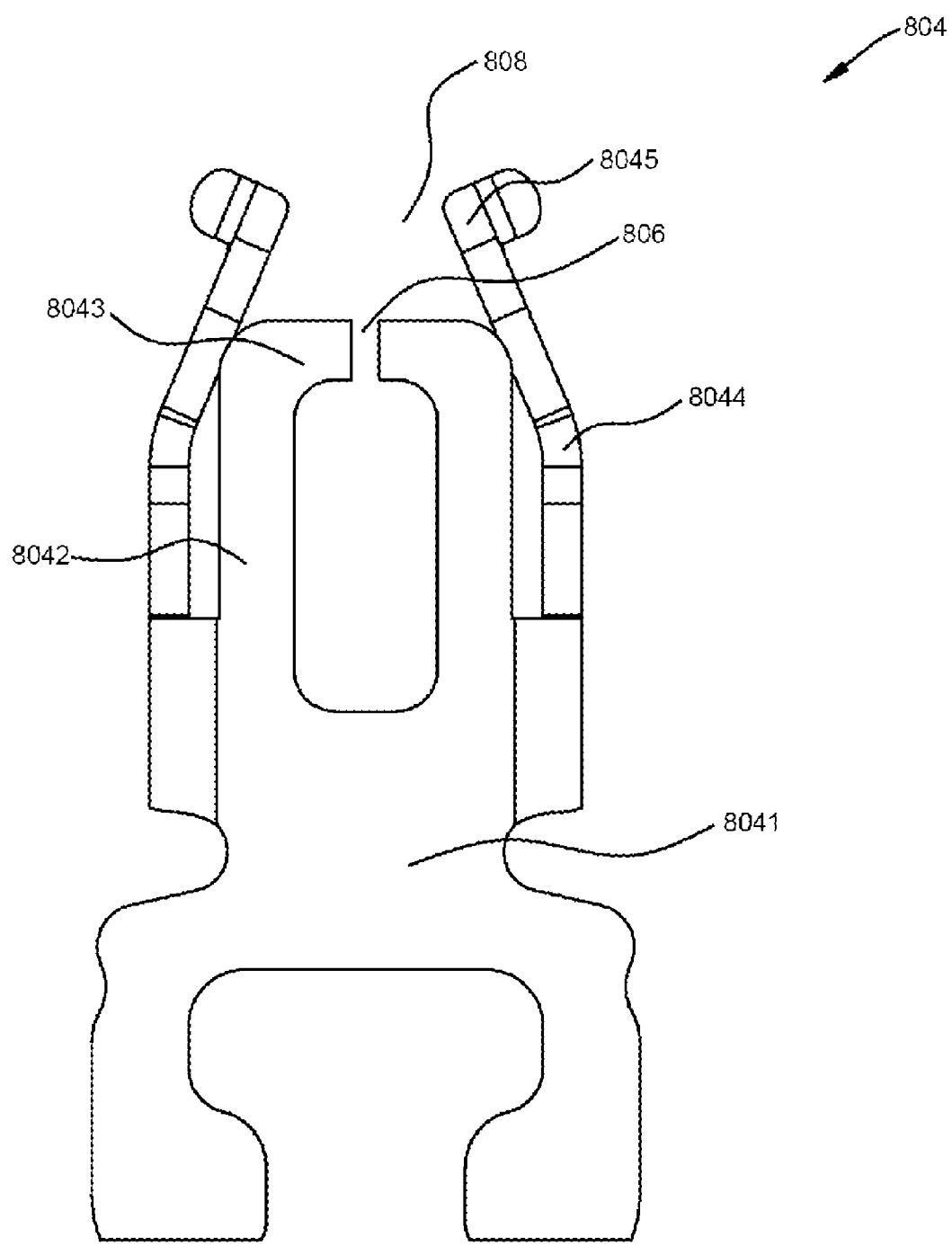
FIG. 1 is a schematic view of a terminal in the related art.

The electrical connector of the present invention is further described in detail below with reference to the accompanying drawings and specific embodiments.

The present invention is more particularly described in the following examples that are intended as illustrative only since numerous modifications and variations therein will be apparent to those skilled in the art. Various embodiments of the invention are now described in detail. Referring to the drawings, FIGS. 4-19, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, the terms "comprising," "including," "having," "containing," "involving," and the like are to be understood to be open-ended, i.e., to mean including but not limited to.

Figure 2:
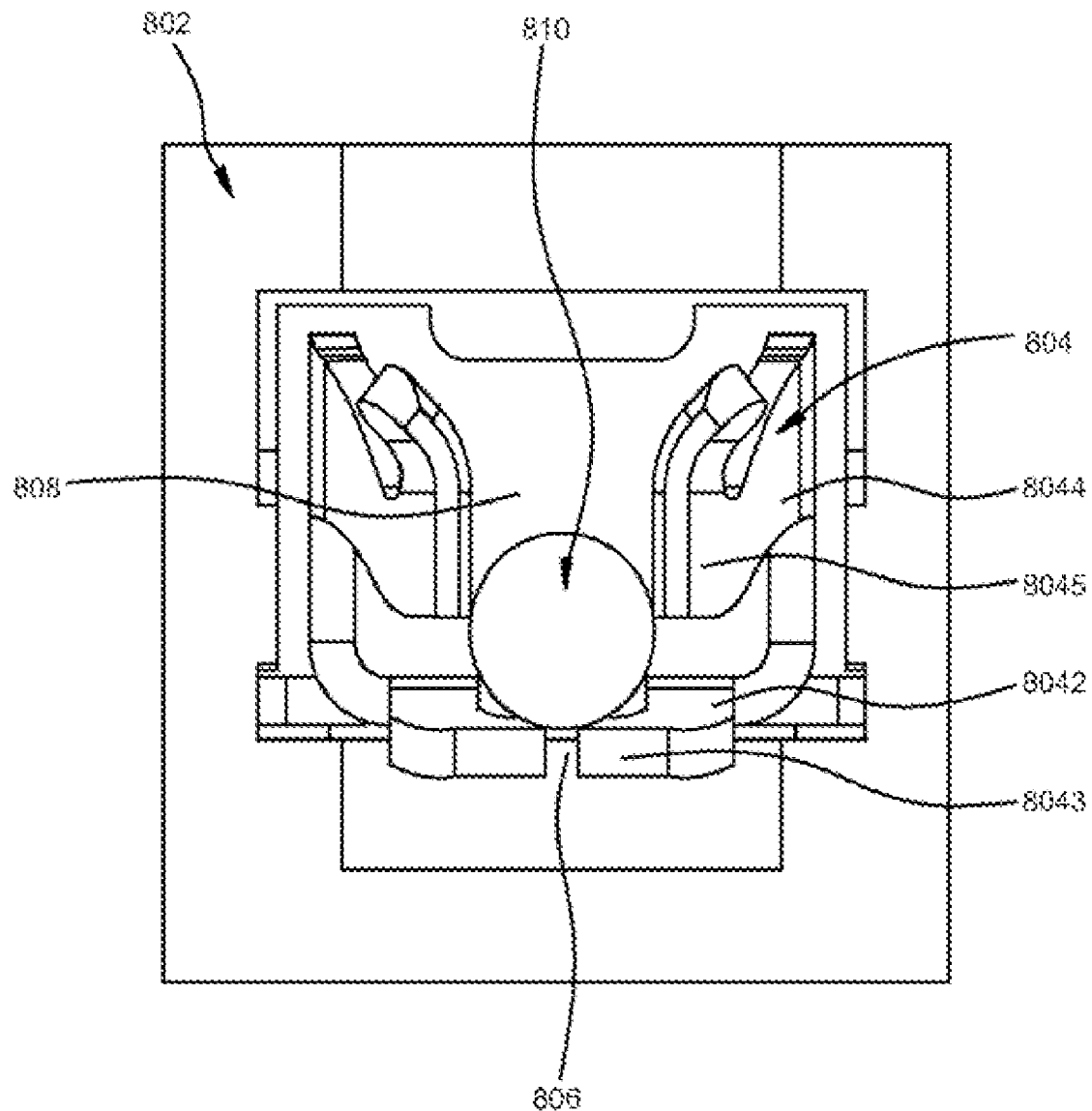
FIG. 2 is a schematic view of an electrical connector fitted to a pin of a chip module in the related art.
Figure 3:
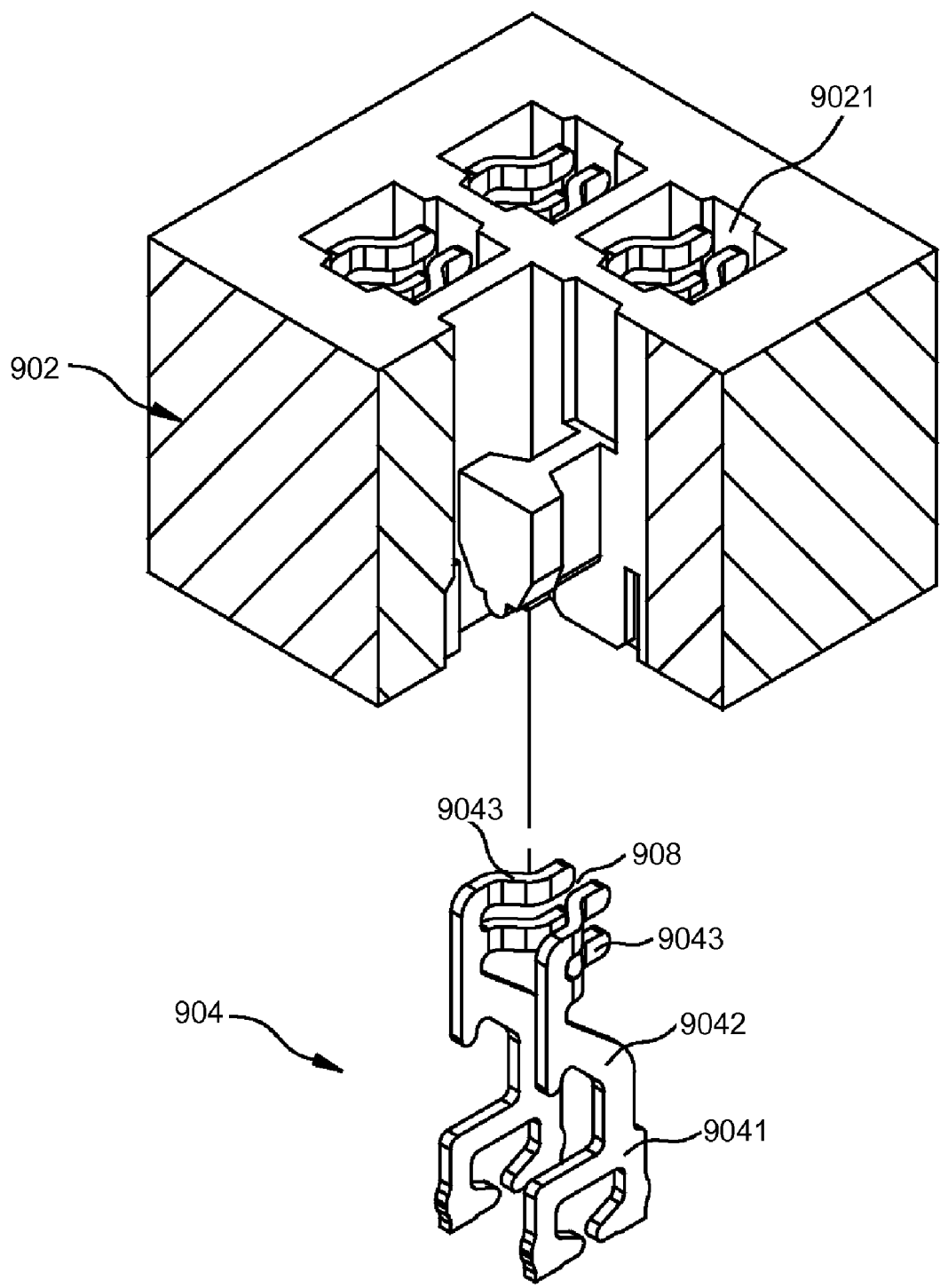
FIG. 3 is an exploded view of an electrical connector in the related art.

A list of reference numerals with corresponding components as shown in the drawings is given below only for the purpose of a reader's convenience:

List of Reference Numerals in FIGS. 1-3 is provided as follows:

Insulating body 802
Terminal 804
Basal portion 8041
Elastic arm 8042
Abutting section 8043
Arm portion 8044
Contact portion 8045
Gap 806
Accommodating space 808
Pin 810
Insulating body 902
Receiving hole 9021
Terminal 904
Basal portion 9041
Elastic arm 9042
Contact arm 9043
Receiving space 908

List of Reference Numerals in electrical connector according to one or more embodiments of the present invention as shown FIGS. 4-19 is provided as follows:
 Chip module 1
 Contact pin 11
 Base 2
 Conductive area 21
 Accommodating hole 211
 Recessed portion 212
 Driving end 22
 Perforation 221
 First notch 222
 Conductive terminal 3
 Basal portion 31
 Retaining hole 311
 Opening 312
 Elastic pressing portion 313
 Resisting portion 314
 First connecting portion 32
 First contact arm 33
 First contact portion 331
 Second contact arm 34
 Second contact portion 341
 Second connecting portion 35
 Third connecting portion 36
 Fixing portion 361
 Soldering portion 37
 Retaining arm 371
 Fourth connecting portion 38
 Stopping arm 39
 Solder ball 4
 Cover 5
 Insertion area 51
 Hole 511
 Mounting area 52
 Through hole 521
 Second notch 522
 Rotary pin 61
 Head portion 611
 Cylinder 612
 Protection means 62
 Main body 621
 Supporting arm 622
 Through bore 6221
 End section 6222
 Receiving seat 63
 Bottom portion 631
 Extending portion 632
 Chamfer 6321
 Clearance 7
 Gap 8
 Receiving space 9

Referring now to FIGS. 4 to 10, a first embodiment of the electrical connector of the present invention is shown. The electrical connector is used for a plurality of contact pins 11 of a chip module 1 to insert, and includes a base 2, a plurality of conductive terminals 3 disposed in the base 2 (one end of each of the conductive terminals 3 is connected to a solder ball 4), a cover 5 covered on the base 2, and a driving mechanism for driving the cover 5 to slide relative to the base 2.

Figure 4:
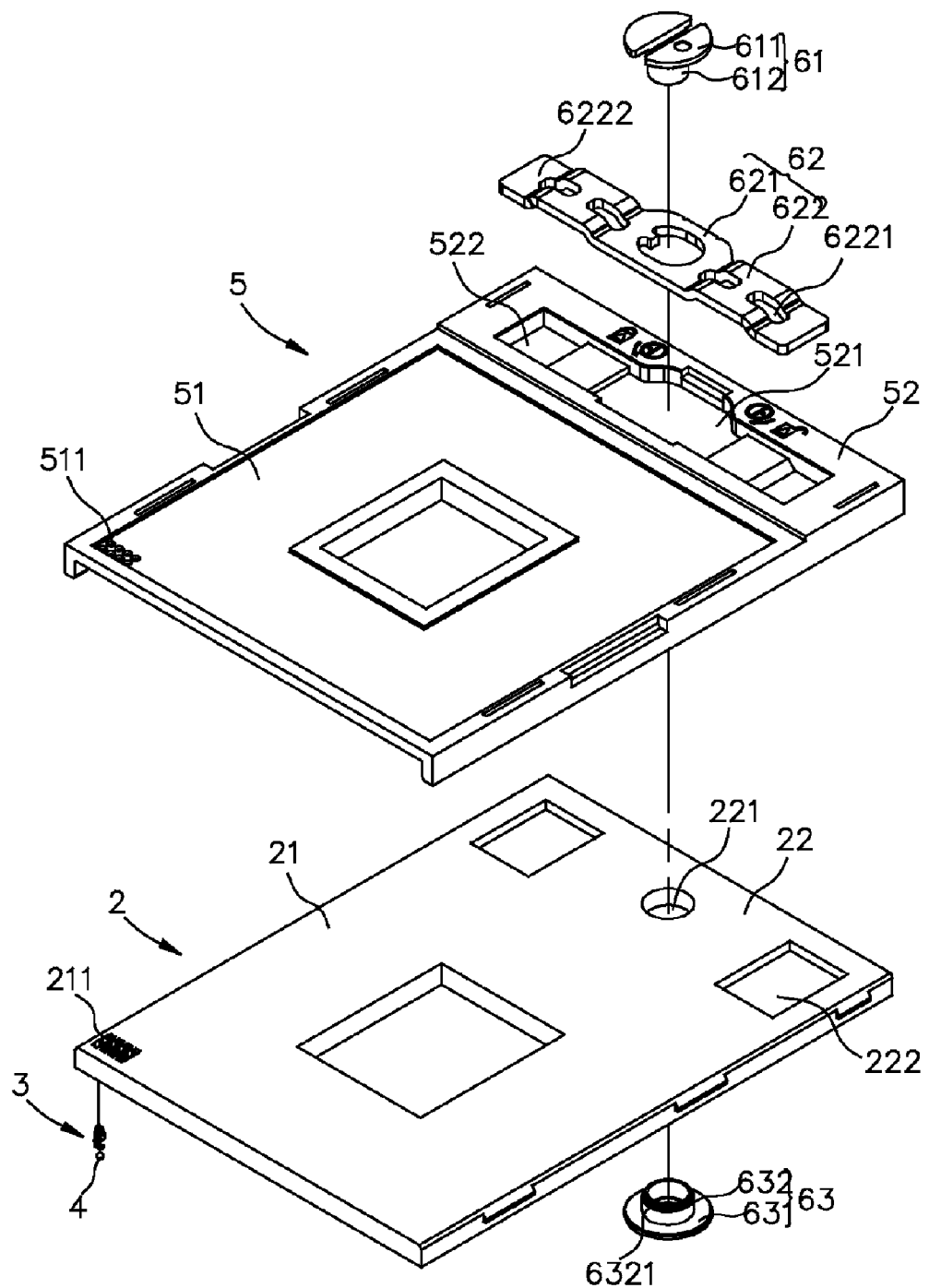
FIG. 4 is an exploded view of a first embodiment of an electrical connector of the present invention.

Referring to FIG. 4, the base 2 has a conductive area 21 and a driving end 22 located at one end of the conductive area 21. The conductive area 21 has a plurality of accommodating holes 211 formed through the base 2, and each of the accommodating holes 211 receives a corresponding one of the conductive terminals 3. A perforation 221 is formed substantially at a middle part of the driving end 22. The driving end 22 is recessed downwards to respectively form a first notch 222 at each of two opposite sides of the perforation 221.

Figure 5:
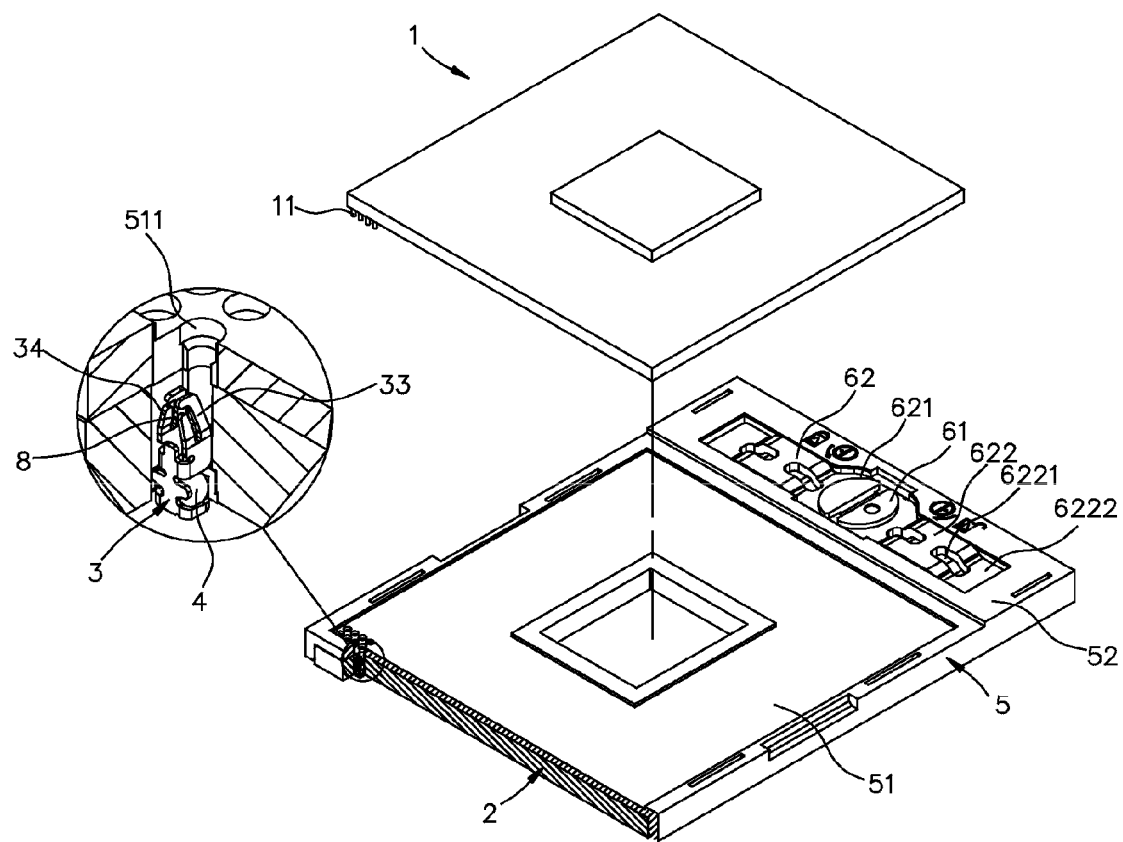
FIG. 5 is a schematic view showing an assembling relation of the electrical connector in the first embodiment of the electrical connector of the present invention and a chip module.
Figure 8:
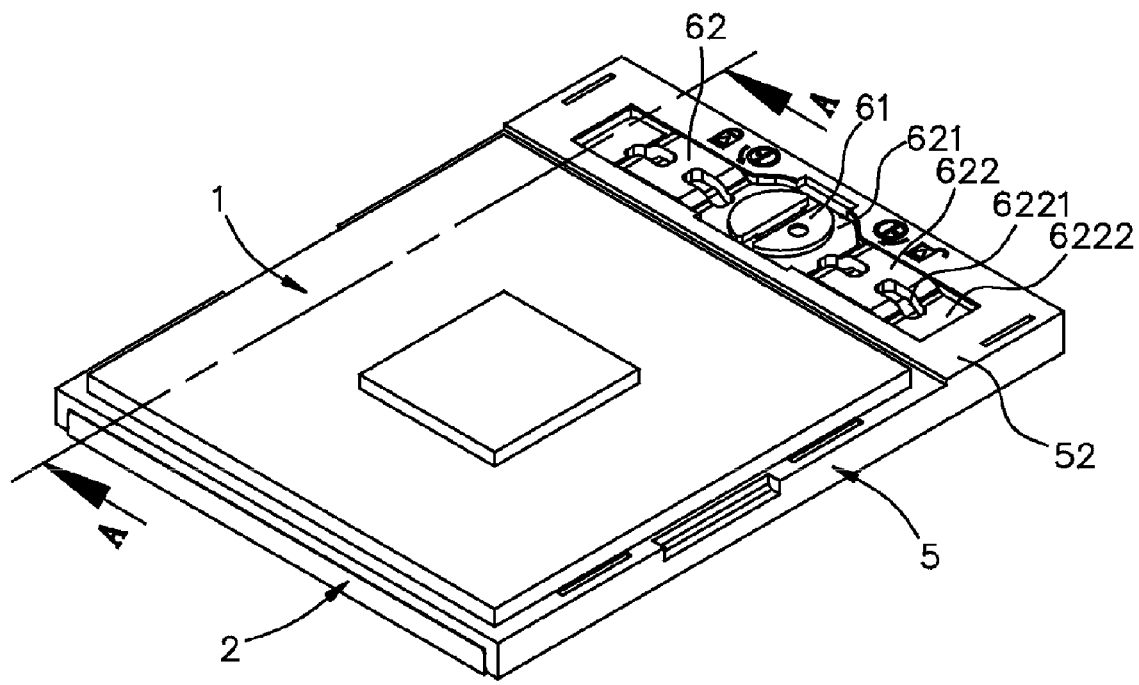
FIG. 8 is an assembled view of the electrical connector in the first embodiment of the electrical connector of the present invention and a chip module.

Referring to FIGS. 4, 5 and 8, the cover 5 is used for supporting the chip module 1, and the cover 5 is configured with an insertion area 51 corresponding to the conductive area 21 and a mounting area 52 corresponding to the driving end 22. The insertion area 51 is provided with a plurality of holes 511 for the contact pin 11 to pass through to enter the corresponding accommodating hole 211. A through hole 521 corresponding to the perforation 221 is formed in the mounting area 52, and the driving mechanism passes through the perforation 221 and the through hole 521, so as to combine the cover 5 with the base 2. Thus, when the driving mechanism is driven, the cover 5 slides relative to the base 2. In addition, the mounting area 52 is recessed downwards to respectively form a second notch 522 at two sides of the through hole 521, and each of the second notches 522 projects downwards from a bottom surface of the cover 5. The second notch 522 is received in the corresponding first notch 222.

Figure 9:
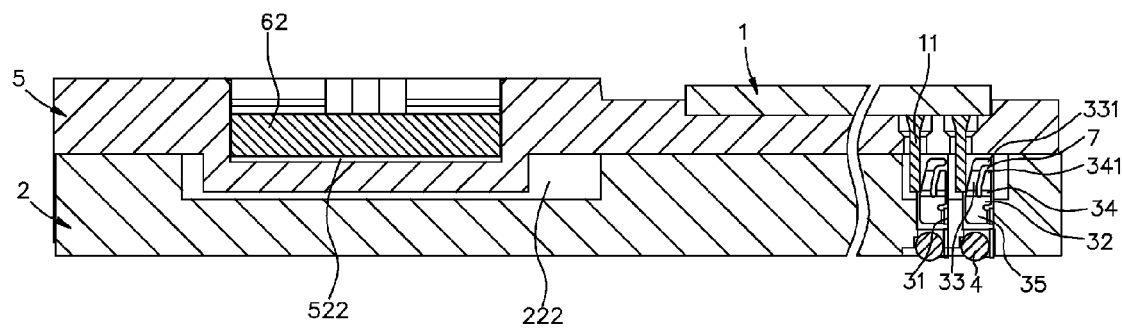
FIG. 9 is a schematic view showing an assembling relation of a contact pin of the chip module and the conductive terminal along Direction A-A shown in FIG. 8.

Referring to FIGS. 4 and 8, the driving mechanism is used for driving the cover 5, so as to drive the chip module 1 to move backwards and forwards relative to the base 2. The driving mechanism includes a rotary pin 61, a protection means 62 and a receiving seat 63. The rotary pin 61 includes a head portion 611 and a solid cylinder 612 extending from the head portion 611. The protection means 62 is disposed in the mounting area 52, and has a main body 621 of a hollow structure and a supporting arm 622 respectively bent upwards and extending from two opposite sides of the main body 621. The main body 621 is located in the through hole 521, and has a bottom portion substantially aligned with the bottom surface of the cover 5 (as shown in FIG. 9). The supporting arm 622 has a top surface substantially aligned with that of the mounting area 52. Each of the supporting arms 622 is provided with a through bore 6221 at the bent portion. The supporting arm 622 has an end section 6222 in the same horizontal plane as the main body 621, and the end section 6222 is located in the second notch 522. The receiving seat 63 is a hollow structure, and has a bottom portion 631 and an extending portion 632 extending from the bottom portion 631. A periphery at a tail end of the extending portion 632 has a chamfer 6321 facing inwards, so as to prevent the extending portion 632 from colliding with an inner edge of the main body 621 due to the tolerance introduced during manufacturing. The cylinder 612 of the rotary pin 61 passes through the main body 621 of the protection means 62, the through hole 521 and the perforation 221 from above the cover 5, and the extending portion 632 of the receiving seat 63 enters the perforation 221 upwards from below the base 2 and is fitted to the cylinder 612, thereby combining the cover 5 with the base 2.

Figure 6:
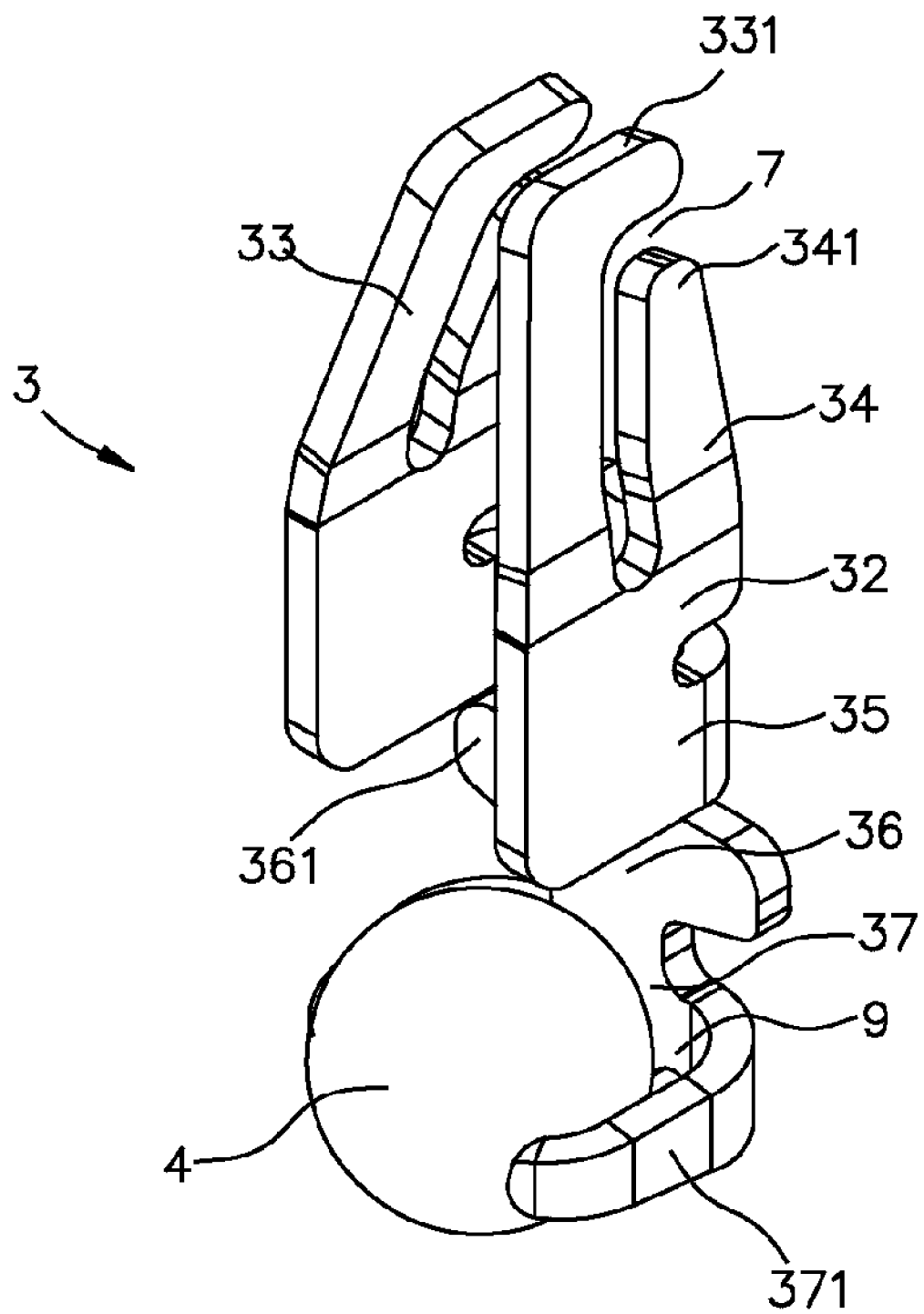
FIG. 6 is a schematic view of the conductive terminal shown in FIG. 5 fitted to a solder ball.
Figure 7:
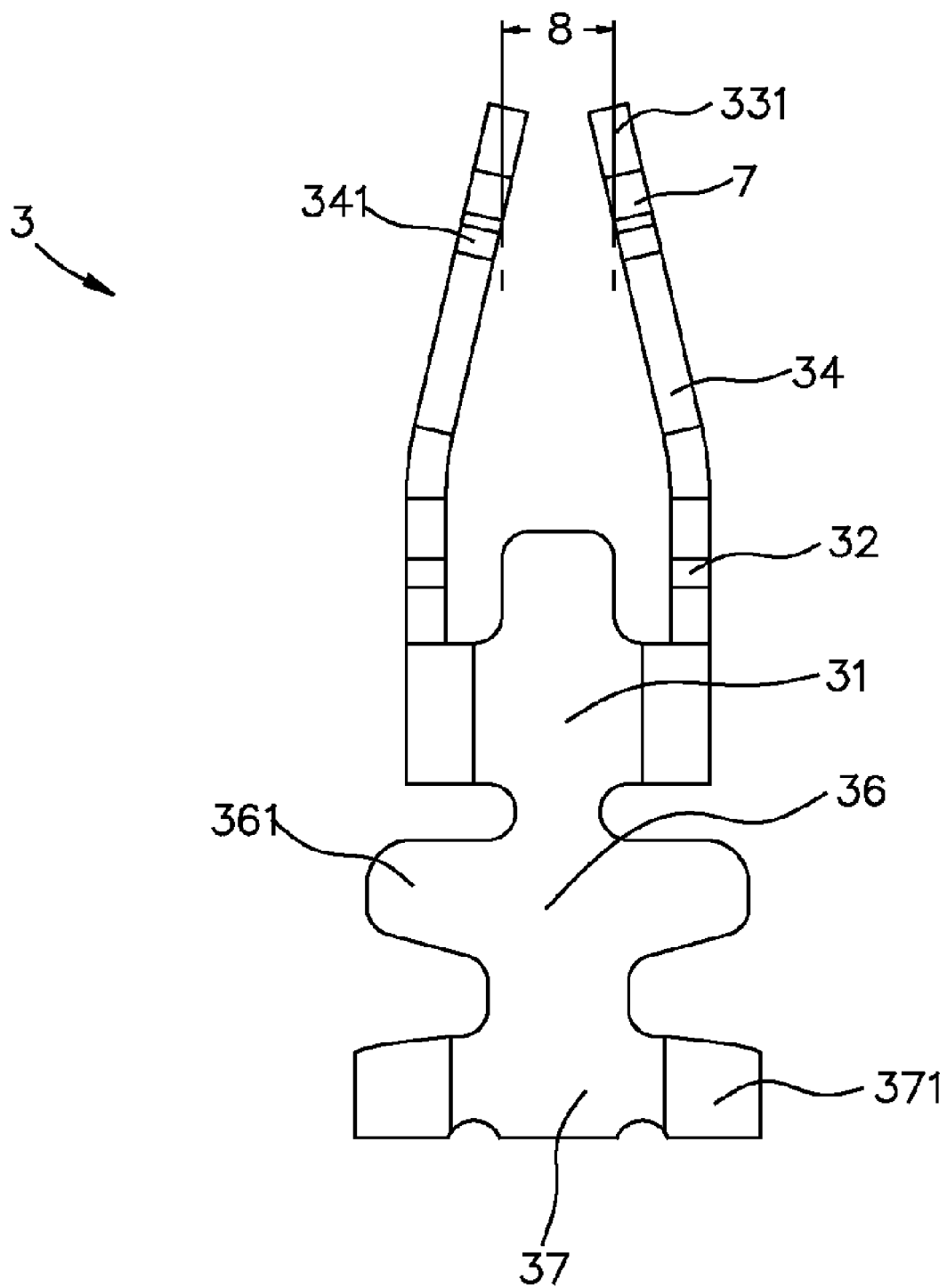
FIG. 7 is a back view of the conductive terminal in the first embodiment of the electrical connector of the present invention.

Referring to FIGS. 5 to 7, each of the conductive terminals 3 has a basal portion 31. The basal portion 31 is connected upwards to two first connecting portions 32 disposed opposite to each other. The two first connecting portions 32 are respectively located at left and right sides of a moving direction of the contact pin 11. A first contact arm 33 and a second contact arm 34 respectively extend upwards from each of the paired first connecting portions 32. The two first contact arms 33 are respectively bent towards each other during extension, and the two second contact arms 34 are respectively bent towards each other during extension. When viewed from a thickness direction of the conductive terminal 3, the first contact arm 33 and the second contact arm 34 on the same first connecting portion 32 overlap and have the same curvature. The two first contact arms 33 and the two second contact arms 34 on the same conductive terminal 3 are respectively used for conducting the contact pin 11, so as to form a four-point contact, and elastically deform in directions substantially perpendicular to the moving direction of the contact pin 11.

The first contact arm 33 and the second contact arm 34 on the same first connecting portion 32 are at different heights. The first contact arm 33 is higher than the second contact arm 34. The contact pin 11 is pushed from the first contact arm 33 towards the second contact arm 34.

Each of the first contact arms 33 extends laterally to form a first contact portion 331. A tail end of each of the second contact arms 34 is provided with a second contact portion 341. The first contact portion 331 is located right above the second contact portion 341, and the first contact portion 331 is spaced by a clearance 7 from a top portion of the second contact portion 341. A gap 8 is formed between the two second contact portions 341 of the same conductive terminal 3. The two first contact portions 331 are located in an extension plane of the gap 8, and located above the gap 8.

The basal portion 31 is connected to the first connecting portion 32 through a second connecting portion 35. The second connecting portion 35 extends forwards from the basal portion 31. Each of the first connecting portions 32 is connected downwards to an upper end of the corresponding second connecting portion 35.

The basal portion 31 extends downwards to form a third connecting portion 36. Two sides of the third connecting portion 36 respectively extend to form a fixing portion 361. The fixing portions 361 are flat (Evidently, the fixing portions 361 may be bent backwards in other embodiments), and are fixed in the accommodating hole 211, such that the conductive terminal 3 is fixed in the accommodating hole 211.

The third connecting portion 36 extends downwards to form a soldering portion 37, for being connected to one of the solder balls 4. The soldering portion 37 has two retaining arms 371 located in front of the basal portion 31. The two retaining arms 371 are disposed opposite to each other and form a receiving space 9. The solder ball 4 is received in the receiving space 9. The two retaining arms 371 penetrate into the solder ball 4 after the solder ball 4 is melted. The retaining arm 371 is in the shape of a projecting arc. The soldering portion 37 may be connected downwards to a feeder.

The third connecting portion 36 has a diffusion inhibition (not shown) area formed by laser at one side thereof facing the solder ball 4 and at the connection position with the soldering portion 37, so as to prevent the molten solder ball from climbing along the third connecting portion 36.

Referring to FIG. 4, during assembly, first, each of the conductive terminals 3 is installed in the corresponding accommodating hole 211 from bottom to top, such that the fixing portion 361 is fitted to a fixing structure of the accommodating hole 211, so as to stably fix the conductive terminal 3 in the accommodating hole 211.

Then, the cover 5 is covered on the base 2, such that the insertion area 51 is corresponding to the conductive area 21, the mounting area 52 is corresponding to the driving end 22, and the through hole 521 is corresponding to the perforation 221.

Finally, the driving mechanism is mounted, in which the protection means 62 is disposed in the mounting area 52, the end section 6222 enters the second notch 522. The rotary pin 61 passes through the main body 621, the through hole 521 and the perforation 221 downwards from above the cover 5, the receiving seat 63 enters the perforation 221 upwards from the base 2 and is fitted to the rotary pin 61, so as to combine the cover 5 with the base 2.

Figure 10:
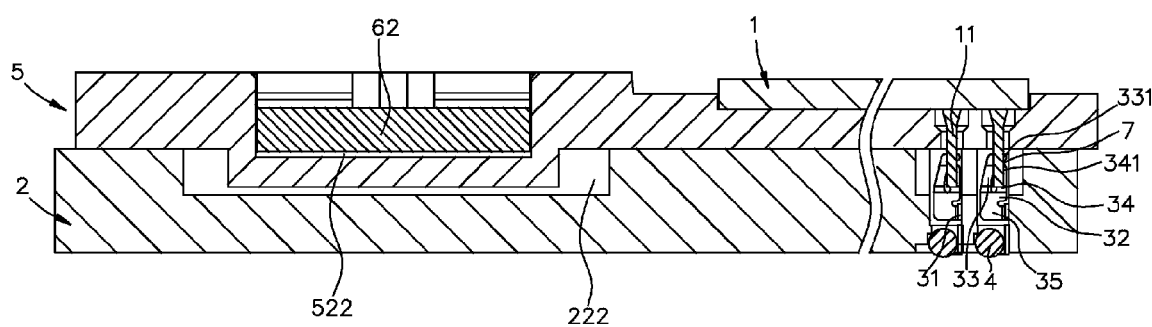
FIG. 10 is a schematic view of the contact pin of the chip module fitted to the conductive terminal shown in FIG. 9.

Referring to FIGS. 8 to 10, when the chip module 1 is supported on the electrical connector, the contact pin 11 passes through the hole 511 and enters the accommodating hole 211 there-below. The contact pin 11 then drives the rotary pin 61 to actuate the cover 5 to slide relative to the base 2, so as to push the chip module 1 to move forwards and backwards relative to the base 2. Accordingly, the contact pin 11 is pushed from the first contact arm 33 towards the second contact arm 34, and finally contacts the two first contact portions 331 and the two second contact portions 341. Since the two first contact arms 33 and the two second contact arms 34 on the same conductive terminal 3 directly extend from the basal portion 31, are independent of each other and does not interfere with each other, a stable four-point contact with the contact pin 11 is formed. In addition, the first contact arms 33 and the second contact arms 34 elastically deform in directions substantially perpendicular to the moving direction of the contact pin 11. The clamping forces exerted by the first contact arms 33 and the second contact arms 34 on the contact pin 11 counteract each other, which avoids the problem that the contact pin 11 is deformed when the contact pin 11 is under a counter thrust in the moving direction thereof and no force is provided to counteract the counter thrust.

Figure 11:
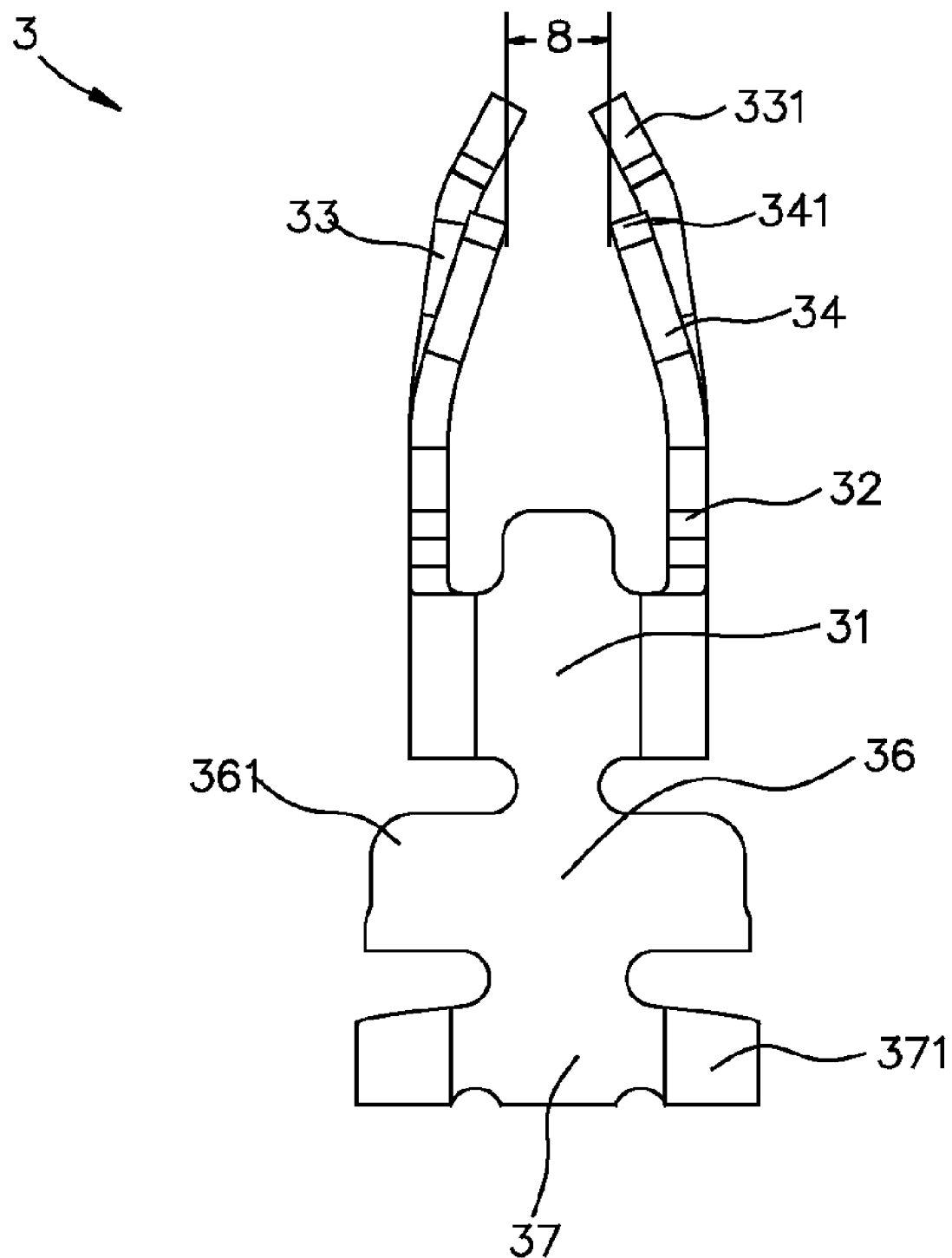
FIG. 11 is a back view of a conductive terminal in a second embodiment of the electrical connector of the present invention.

Referring to FIG. 11, a second embodiment of the electrical connector of the present invention is shown. The difference between the second embodiment and the first embodiment lies in that when viewed from a thickness direction of the conductive terminal 3, the second contact arm 34 is closer to the contact pin 11 than the first contact arm 33 on the same first connecting portion 32.

This embodiment can further achieve the following effect in addition to those of the first embodiment: when the contact pin 11 is conducted with the first contact arms 33 and the second contact arms 34, the second contact arm 34 may be expanded outwards as the first contact arm 33 elastically deforms outwards. Here, the second contact arm 34 is disposed closer to the contact pin 11, so as to ensure that the second contact arm 34 contacts the contact pin 11, thereby ensuring a stable four-point contact.

Figure 12:
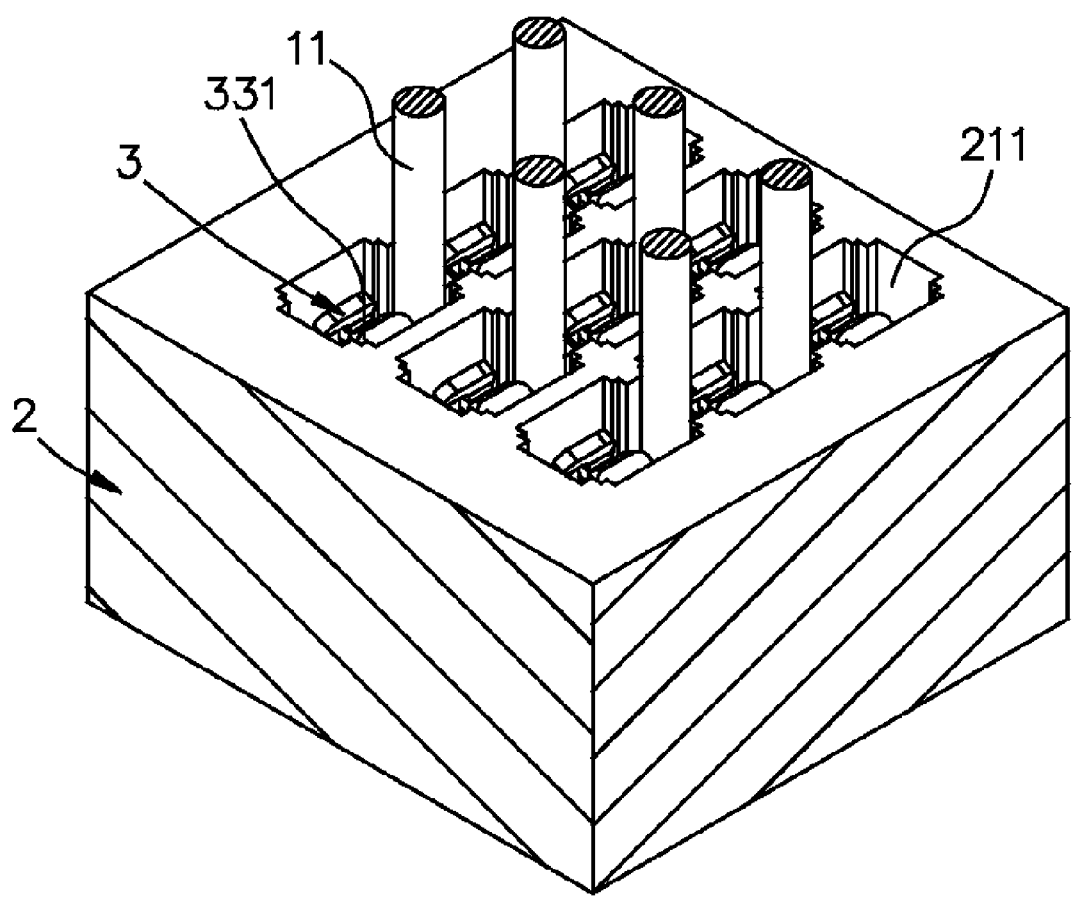
FIG. 12 is a schematic view showing an assembling relation of an electrical connector in a third embodiment of the electrical connector of the present invention and a contact pin of a chip module.
Figure 13:
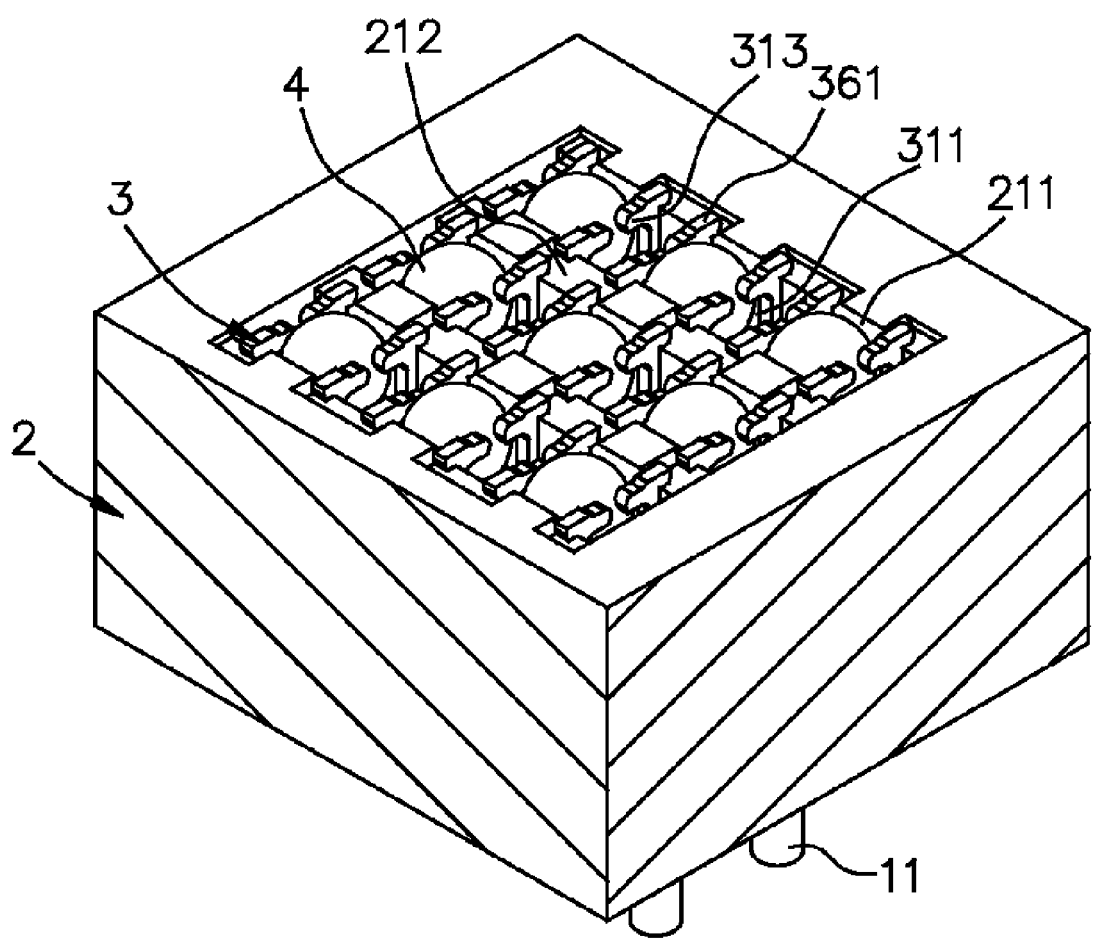
FIG. 13 is a view of FIG. 12 from another angle.
Figure 14:
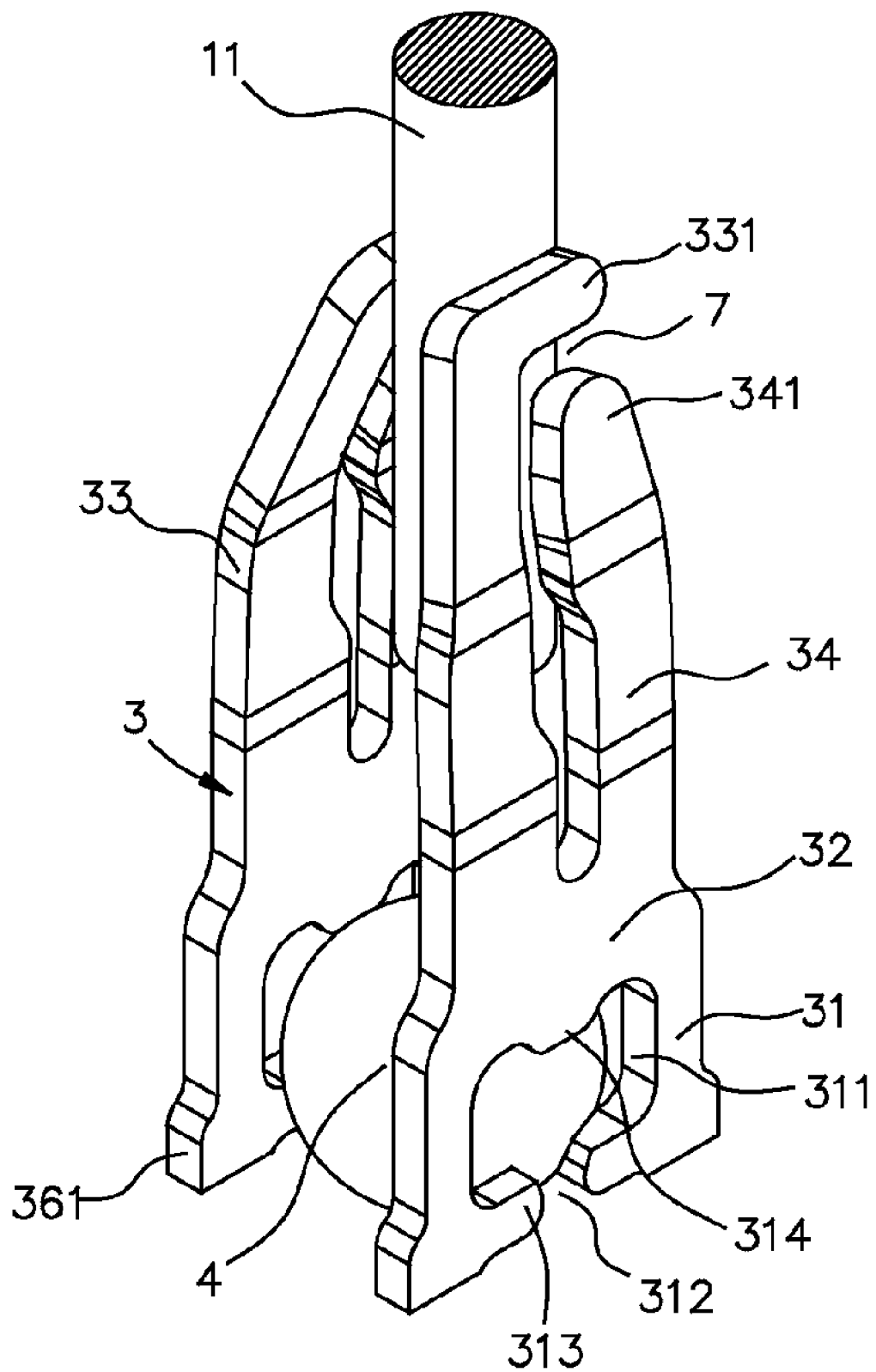
FIG. 14 is a schematic view of a conductive terminal in the electrical connector of the present invention fitted to a solder ball and a contact pin.

Referring to FIGS. 12 to 14, a third embodiment of the electrical connector of the present invention is shown. The difference between the third embodiment and the first embodiment lies in that a bottom portion of the conductive area 21 is provided with a plurality of recessed portions 212. The recessed portions 212 are disposed between two adjacent accommodating holes 211, and located between two opposite sides of a side wall between two adjacent accommodating holes 211. The recessed portions 212 in the same row are in communication. The recessed portions 212 are used to simplify the die for molding the base 2.

The conductive terminal 3 neither has the second connecting portion 35 nor has the third connecting portion 36. Each of the conductive terminals 3 has two basal portions 31. The two basal portions 31 are disposed separately. Each of the first connecting portions 32 is separately connected to one of the basal portions 31 respectively. That is, the conductive terminal 3 is formed by two separate conductive sheets.

The basal portion 31 is a soldering portion. The soldering portion has a retaining hole 311. An opening 312 in communication with the retaining hole 311 is formed at a lower end of the retaining hole 311, such that the soldering portion forms two elastic pressing portions 313. An inner edge of each of the retaining holes 311 is provided with a resisting portion 314 protruding downwards from a lower end of the first connecting portion 32. The resisting portion 314 and the two elastic pressing portions 313 provide a three-point fixation for the solder ball 4.

The fixing portions 361 are located at two opposite sides of a tail end of the basal portion 31. Each of the fixing portions 361 is fastened to the corresponding recessed portion 212, such that the conductive sheet is fixed in the accommodating holes 211.

This embodiment can also achieve the effects of the first embodiment, which will not be described in detail herein again.

Figure 15:
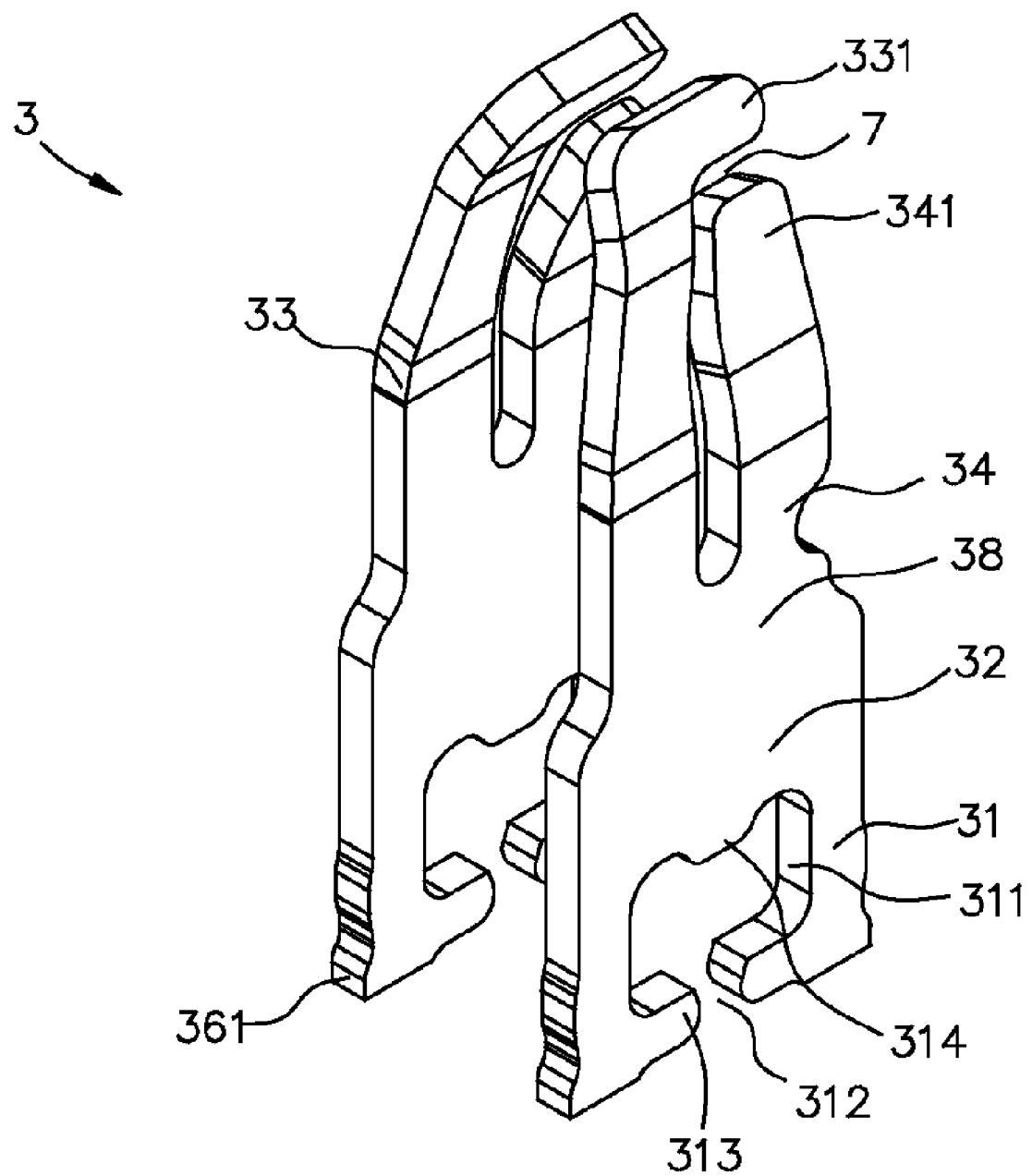
FIG. 15 is a schematic view of a conductive terminal in a fourth embodiment of the electrical connector of the present invention.
Figure 16:
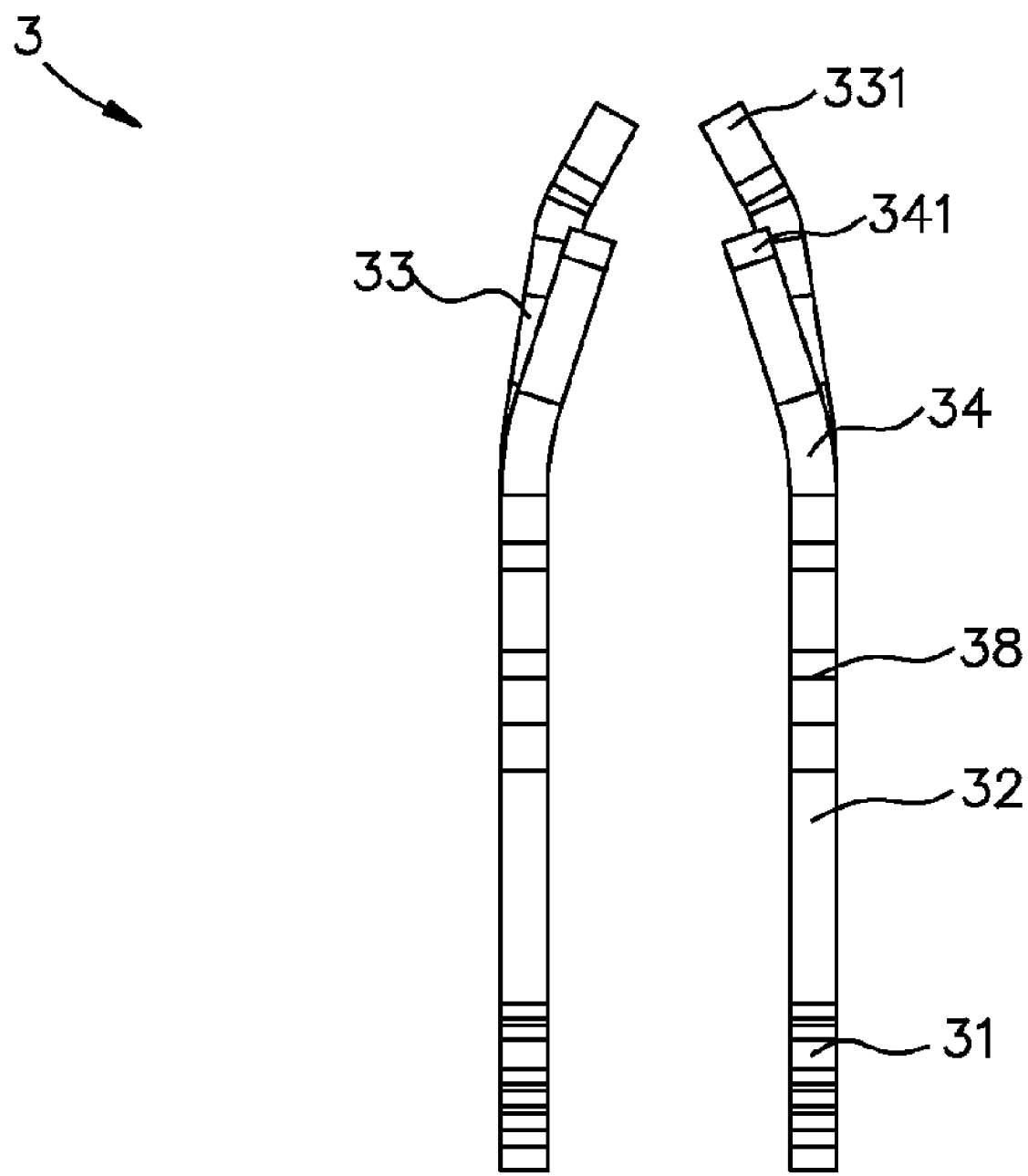
FIG. 16 is a back view of the conductive terminal shown in FIG. 15.

Referring to FIGS. 15 and 16, a fourth embodiment of the electrical connector of the present invention is shown. According to the structure of the third embodiment, in this embodiment, each of the first connecting portions 32 extends upwards to form a fourth connecting portion 38. The first contact arm 33 and the second contact arm 34 extend upwards from the fourth connecting portion 38. When viewed from a thickness direction of the conductive terminal 3, the second contact arm 34 is closer to the contact pin 11 than the first contact arm 33 on the same first connecting portion 32.

This embodiment can further achieve the following effect in addition to those of the third embodiment and the second embodiment: when the conductive terminal 3 is fixed in the accommodating hole 211, a fit clearance exists between the accommodating hole 211 and the conductive sheet. Since the first connecting portion 32 extends upwards to form the fourth connecting portion 38, the offset of the conductive sheet when undergoing elastic deformation is reduced, thereby achieving a more accurate contact of the conductive terminal 3 and the pin 11.

Figure 17:
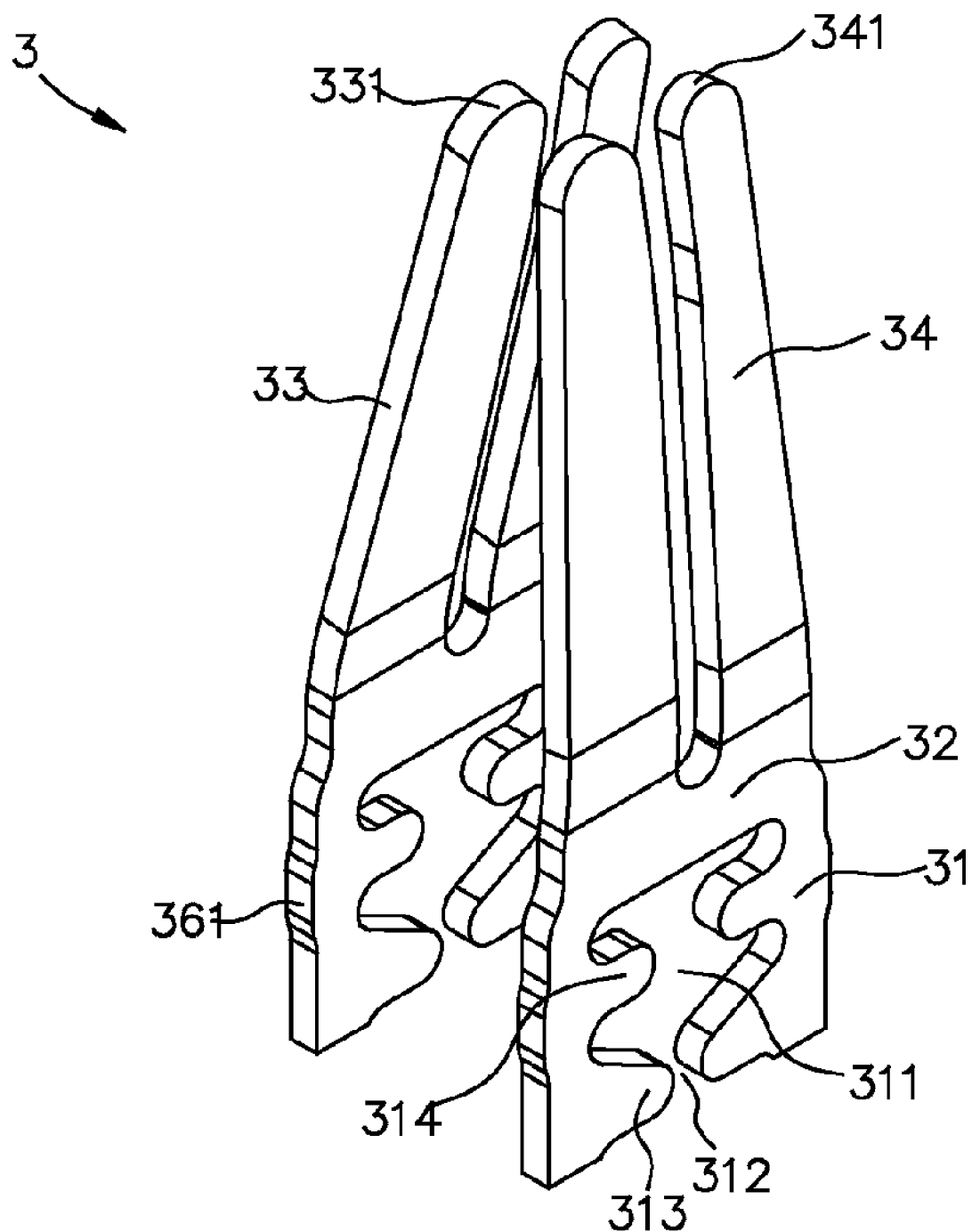
FIG. 17 is a schematic view of a conductive terminal in a fifth embodiment of the electrical connector of the present invention.
Figure 18:
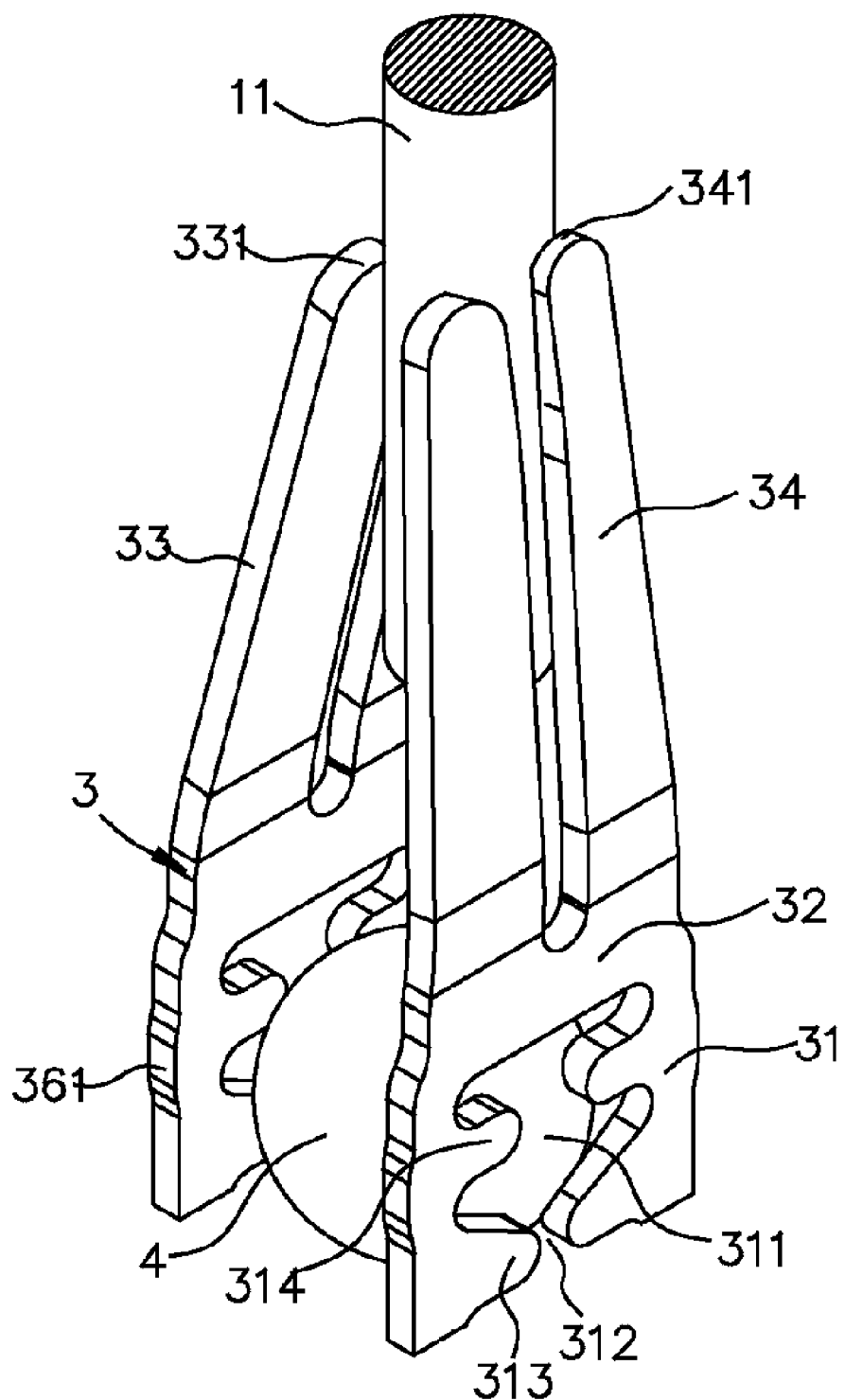
FIG. 18 is a schematic view of the conductive terminal in the fifth embodiment of the electrical connector of the present invention fitted to a solder ball and a contact pin.

Referring to FIGS. 17 and 18, a fifth embodiment of the electrical connector of the present invention is shown. The difference between the fifth embodiment and the third embodiment lies in that the bottom portion of the conductive area 21 is not provided with the recessed portions 212. The fixing portions 361 are substantially located at middle parts of two opposite sides of the basal portion 31.

The first contact arm 33 and the second contact arm 34 of the same first connecting portion 32 are disposed at the same height. The contact pin 11 is pushed from the first contact arm 33 towards the second contact arm 34. The second contact arm 34 has a width smaller than that of the first contact arm 33. The first contact portion 331 is disposed at a tail end of the first contact arm 33, and a center line of the first contact portion 331 overlaps that of the first contact arm 33. Each of the first contact arms 33 gradually shrinks, and each of the second contact arms 34 gradually shrinks.

Two resisting portions 314 are disposed in each of the retaining holes 311. The two resisting portions 314 are disposed opposite to each other and at the same height. The two resisting portions 314 and the two elastic pressing portions 313 provide a four-point fixation for the solder ball 4.

This embodiment can further achieve the following effect in addition to those of the first embodiment: when the contact pin 11 is pushed from the first contact arm 33 towards the second contact arm 34 and is conducted with the conductive terminal 3, since the width of the second contact arm 34 is smaller than that of the first contact arm 33, the contact pin 11, after overcoming the resistance of the first contact arm 33, slides forwards more easily and thus is fastened between the two first contact arms 33 and the two second contact arms 34, such that the first contact portion 331 and the second contact portion 341 tightly clamp the contact pin 11.

Figure 19:
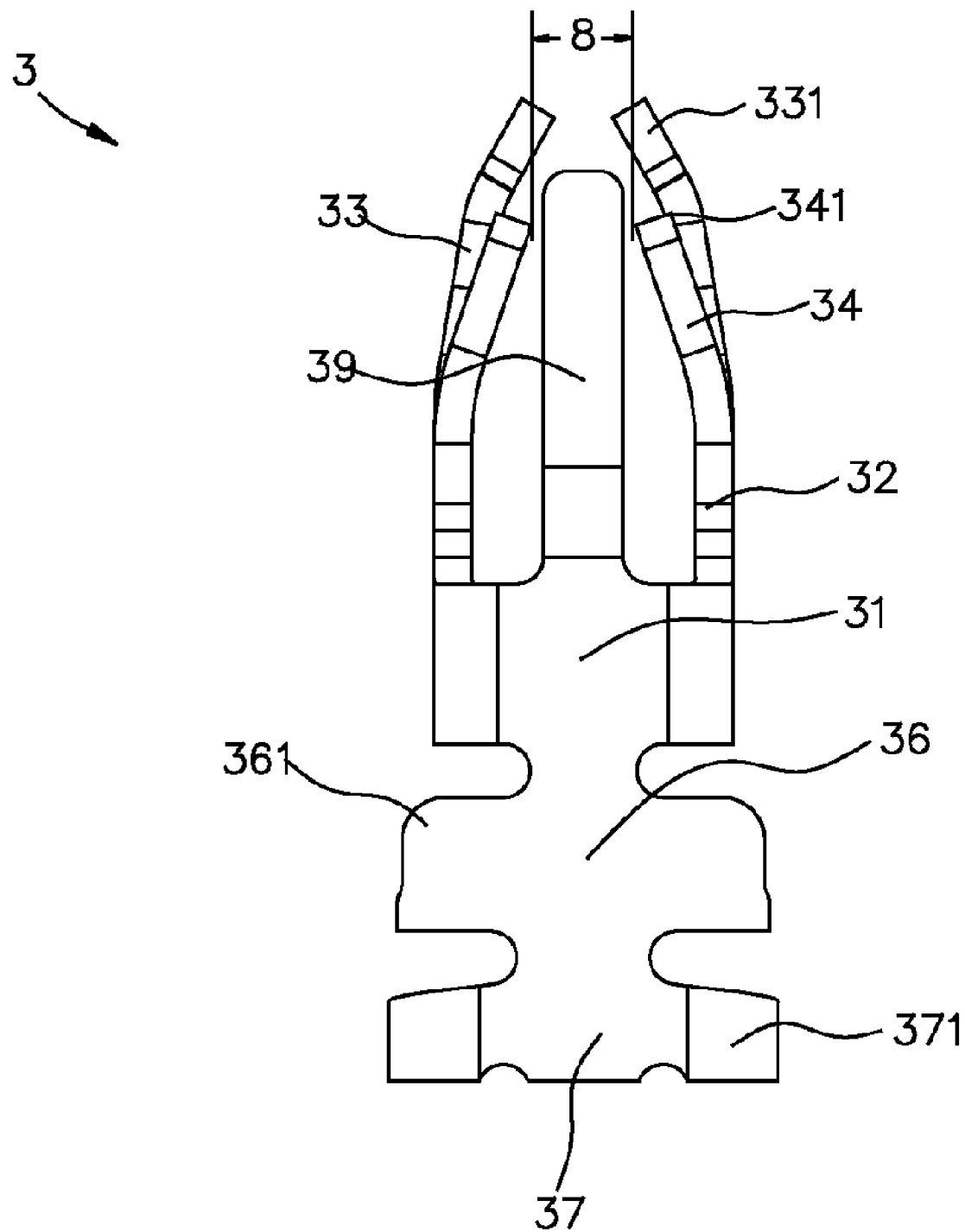
FIG. 19 is a back view of a conductive terminal in a sixth embodiment of the electrical connector of the present invention.

Referring to FIG. 19, a sixth embodiment of the electrical connector of the present invention is shown. According to the structure of the second embodiment, in this embodiment, a middle part of an upper end of the basal portion 31 extends upwards to form a stopping arm 39, so as to prevent the contact pin 11 from excessive sliding. The stopping arm 39, the two first contact portions 331 and the two second contact portions 341 form a five-point contact with the contact pin 11, which further increases the contact area of the contact pin 11, thereby achieving a more stable contact performance.

Based on the above disclosure, among other things, the electrical connector of the present invention at least has the following beneficial effects.

1. When the contact pin is pushed from the first contact arm towards the second contact arm, and is conducted with the first contact arm and the second contact arm, since the first contact arm and the second contact arm on the same first connecting portion are independent of each other, one of the first contact arm and the second contact arm will not be expanded outwards when the other one elastically deforms. Therefore, it is ensured that the first contact arm and the second contact arm clamp the contact pin independently, so as to achieve a real four-point contact between the contact pin and the conductive terminal, thereby ensuring the contact performance of the chip module with the electrical connector.

2. The first contact arms and the second contact arms elastically deform in directions substantially perpendicular to the moving direction of the contact pin. Thus, when the contact pin is conducted with the first contact arms and the second contact arms at left and right sides thereof, the clamping forces exerted by the first contact arms and the second contact arms at the left and right sides on the contact pin counteract each other. It avoids the problem that the contact pin is deformed when the contact pin is under a counter thrust in the moving direction thereof and no force is provided to counteract the counter thrust.

3. Since the first contact portion extends laterally from the first contact arm and is located above the second contact portion, a stable four-point contact between the contact pin and the conductive terminal can be ensured even if the chip module or the conductive terminal has a tolerance introduced during manufacturing.

4. When viewed from the thickness direction of the conductive terminal, since the second contact arm is closer to the contact pin than the first contact arm on the same first connecting portion, a stable four-point contact between the contact pin and the conductive terminal can be further ensured.

5. When the first contact arm and the second contact arm are disposed at the same height, since the width of the second contact arm is smaller than that of the first contact arm, the contact pin, when being pushed from the first contact arm towards the second contact arm and after overcoming the large resistance of the second contact arm against the contact pin, can slide forwards more easily and thus be fastened between the two first contact arms and the two second contact arms, such that the first contact portion and the second contact portion tightly clamp the contact pin.

6. The soldering portion has the two retaining arms, and the receiving space is formed between the two retaining arms. The solder ball is received in the receiving space and props the two retaining arms. Thus, when the solder ball is melted, the two retaining arms elastically restore to penetrate into the solder ball, so as to ensure stable soldering between the solder ball and the conductive terminal.

7. Each of the first connecting portions extends upwards to form the fourth connecting portion. The first contact arm and the second contact arm extend upwards from the fourth connecting portion. Thus, when the conductive sheet is fixed in the accommodating hole and undergoes elastic deformation, the offset of the conductive sheet when undergoing elastic deformation can be reduced, thereby achieving a more accurate contact of the conductive terminal and the pin.

8. Since the bottom portion of the main body of the protection means is substantially aligned with the bottom surface of the cover, and the top surface of the supporting arm is substantially aligned with that of the mounting area, the driving mechanism can smoothly push the cover, so as to prevent the cover from being upturned due to uneven application of force.

Moreover, in another aspect of the present invention, it is provided a conductive terminal usable in an electrical connector, which is engageable with at least one contact pin of a chip module, and has a base with at least one accommodating hole formed through the base and a cover, positioned on the base and for supporting the chip module, with an insertion area for the at least one contact pin to pass through to enter the corresponding at least one accommodating hole.

In one embodiment, the conductive terminal has a pair of two first connecting portions disposed opposite to each other, and a first contact arm and a second contact arm respectively extending upwards from each of the paired first connecting portions, wherein the two first contact arms and the two second contact arms are respectively located at a first side and an opposite second side of a moving direction of the at least one contact pin and adapted for conducting the at least one contact pin respectively, and wherein, in operation, the two first contact arms and the two second contact arms are elastically deform in directions substantially perpendicular to a moving direction of the at least one contact pin.

In one embodiment, the first contact arm and the second contact arm on the same first connecting portion are located at different heights. The first contact arm is located higher than the second contact arm, and the contact pin is pushed from the first contact arm towards the second contact arm in operation.

In one embodiment, the first contact arm extends laterally to form a first contact portion, a tail end of the second contact arm is provided with a second contact portion, the first contact portion is located above the second contact portion, and the first contact portion is spaced by a clearance from a top portion of the second contact portion. A gap is formed between the two second contact portions, the two first contact portions are located in an extension plane of the gap, and located above the gap. When viewed from a thickness direction of the conductive terminal, the first contact arm and the second contact arm on the same first connecting portion overlap and conform to each other. Additionally, when viewed from a thickness direction of the conductive terminal, the second contact arm is closer to the contact pin than the first contact arm on the same first connecting portion.

In one embodiment, the first contact arm and the second contact arm on the same first connecting portion are disposed at the same height. As formed, the contact pin is pushed from the first contact arm towards the second contact arm in operation, and the second contact arm has a width smaller than that of the first contact arm.

The conductive terminal further includes a basal portion, the two first connecting portions are connected to the same basal portion.

In one embodiment, two sides of the basal portion respectively extend forwards to form a second connecting portion, and each of the first connecting portions is connected downwards to an upper end of the corresponding second connecting portion. The basal portion extends downwards to form a third connecting portion, and two sides of the third connecting portion respectively extend to form a fixing portion. The conductive fixing portion is bent. In one embodiment, the fixing portion is bent backwards.

In one embodiment, the basal portion extends downwards to form a soldering portion, the soldering portion has two retaining arms, and the two retaining arms are disposed opposite to each other and form a receiving space. The two retaining arms are located in front of the basal portion. In one embodiment, each of the retaining arms is in the shape of a projecting arc.

In one embodiment, the conductive terminal further has two basal portions, wherein the two basal portions are disposed separately, and each of the first connecting portions is separately connected to one of the basal portions respectively. The basal portion is a soldering portion, the soldering portion has a retaining hole, and an opening is formed at a lower end of the retaining hole, such that the soldering portion forms two elastic pressing portions.

In one embodiment, a resisting portion is disposed on an inner edge at one side of the retaining hole. The resisting portion protrudes downwards from a lower end of the first connecting portion.

In one embodiment, two resisting portions are disposed in the retaining hole, and the two resisting portions are disposed opposite to each other. The two resisting portions are located at the same height.

In one embodiment, each of the first connecting portions extends upwards to form a fourth connecting portion, the first contact arm and the second contact arm extend upwards from the fourth connecting portion.

In one embodiment, the two first contact arms are respectively bent towards each other during extension, and the two second contact arms are respectively bent towards each other during extension.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A conductive terminal usable in an electrical connector, wherein the electrical connector is engageable with at least one contact pin of a chip module, and has a base with at least one accommodating hole formed through the base, a cover positioned on the base and for supporting the chip module with an insertion area for the at least one contact pin to pass through to enter the corresponding at least one accommodating hole, and a driving mechanism, for driving the cover, so as to drive the chip module to move backwards and forwards relative to the base, wherein the base has a conductive area and a driving end located at one end of the conductive area, the accommodating holes are disposed in the conductive area, a perforation is formed substantially at a middle part of the driving end, the cover is configured with the insertion area corresponding to the conductive area and a mounting area corresponding to the driving end, a through hole corresponding to the perforation is formed in the mounting area, and the driving mechanism passes through the perforation and the through hole; and wherein the driving mechanism comprises a rotary pin, a protection means and a receiving seat, the protection means is disposed in the mounting area, the rotary pin passes through the protection means, the through hole and the perforation from above the cover, and the receiving seat enters the perforation upwards from below the base and is fitted to the rotary pin; and wherein the conductive terminal correspondingly disposed in one of the accommodating holes, comprising:
- a pair of two first connecting portions disposed opposite to each other; and
- a first contact arm and a second contact arm respectively extending upwards from each of the paired first connecting portions, wherein the two first contact arms and the two second contact arms are respectively located at a first side and an opposite second side of a moving direction of the at least one contact pin and adapted for conducting the at least one contact pin respectively, and wherein, in operation, the two first contact arms and the two second contact arms are elastically deformed in directions substantially perpendicular to a moving direction of the at least one contact pin.

2. The conductive terminal according to claim 1, wherein the first contact arm and the second contact arm on the same first connecting portion are disposed at the same height, and the contact pin is pushed from the first contact arm towards the second contact arm, and the second contact arm has a width smaller than that of the first contact arm.

3. The conductive terminal according to claim 1, wherein in the same conductive terminal, the two first contact arms are respectively bent towards each other during extension, and the two second contact arms are respectively bent towards each other during extension.

4. The conductive terminal according to claim 1, wherein each of the conductive terminals has a basal portion, the two first connecting portions of the same conductive terminal are connected to the same basal portion.

5. The conductive terminal according to claim 4 wherein the basal portion extends downwards to form a third connecting portion, and two sides of the third connecting portion respectively extend to form a fixing portion.

6. The conductive terminal according to claim 4, wherein the basal portion extends downwards to form a soldering portion, the soldering portion has two retaining arms, and the two retaining arms are disposed opposite to each other and form a receiving space.

7. The conductive terminal according to claim 1, wherein each of the conductive terminals has two basal portions, the two basal portions are disposed separately, and each of the first connecting portions is separately connected to one of the basal portions respectively.

8. The conductive terminal according to claim 7, wherein the basal portion is a soldering portion, the soldering portion has a retaining hole, and an opening is formed at a lower end of the retaining hole, such that the soldering portion forms two elastic pressing portions.

9. The conductive terminal according to claim 8, wherein a resisting portion is disposed on an inner edge at one side of the retaining hole.

10. The conductive terminal according to claim 1, wherein the first contact arm is higher than the second contact arm on the same first connecting portion, and the contact pin is pushed from the first contact arm towards the second contact arm.

11. The conductive terminal according to claim 10, wherein the first contact arm extends laterally to form a first contact portion, a tail end of the second contact arm is provided with a second contact portion, the first contact portion is located above the second contact portion, and the first contact portion is spaced by a clearance from a top portion of the second contact portion.

12. The conductive terminal according to claim 11, wherein a gap is formed between the two second contact portions of the same conductive terminal, the two first contact portions are located in an extension plane of the gap, and located above the gap.

13. The conductive terminal according to claim 12, wherein when viewed from a thickness direction of the conductive terminal, the first contact arm and the second contact arm on the same first connecting portion overlap and conform to each other.

14. The conductive terminal according to claim 12, wherein when viewed from a thickness direction of the conductive terminal, the second contact arm is closer to the contact pin than the first contact arm on the same first connecting portion.

15. An electrical connector, for a plurality of contact pins of a chip module to insert, comprising:
- a base, having a plurality of accommodating holes formed through the base;
- a cover, covered on the base, and for supporting the chip module, wherein the cover is provided with an insertion area for the contact pins to pass through to enter the corresponding accommodating holes;
- a driving mechanism, for driving the cover, so as to drive the chip module to move backwards and forwards relative to the base; and
- a plurality of conductive terminals, each correspondingly disposed in one of the accommodating holes respectively, wherein each of the conductive terminals has two first connecting portions disposed opposite to each other, and respectively located at left and right sides of a moving direction of the contact pin;

wherein a first contact arm and a second contact arm respectively extend upwards from each of the paired first connecting portions, the two first contact arms and the two second contact arms are respectively used for conducting the contact pin, and elastically deformed in directions substantially perpendicular to the moving direction of the contact pin;

wherein the base has a conductive area and a driving end located at one end of the conductive area, the accommodating holes are disposed in the conductive area, a perforation is formed substantially at a middle part of the driving end, the cover is configured with the insertion area corresponding to the conductive area and a mounting area corresponding to the driving end, a through hole corresponding to the perforation is formed in the mounting area, and the driving mechanism passes through the perforation and the through hole; and wherein the driving mechanism comprises a rotary pin, a protection means and a receiving seat, the protection means is disposed in the mounting area, the rotary pin passes through the protection means, the through hole and the perforation from above the cover, and the receiving seat enters the perforation upwards from below the base and is fitted to the rotary pin.

16. The electrical connector according to claim 15, wherein the receiving seat has a bottom portion and an extending portion extending from the bottom portion, and a periphery at a tail end of the extending portion has a chamfer facing inwards.

17. The electrical connector according to claim 15, wherein the driving end is recessed downwards to respectively form a first notch at two opposite sides of the perforation, the mounting area is recessed downwards to respectively form a second notch at two sides of the through hole, and the second notch is corresponding to the first notch.

18. The electrical connector according to claim 15, wherein the protection means has a main body and a supporting arm respectively extending from two opposite sides of the main body, and the supporting arm is bent.

19. The electrical connector according to claim 18, wherein the supporting arm is provided with at least one through bore at the bent portion.

\* \* \* \* \*